United States Patent [19]

Wikström et al.

[11] Patent Number: 4,906,937

[45] Date of Patent: Mar. 6, 1990

[54] METHOD AND A DEVICE FOR FAULT LOCATION IN THE EVENT OF A FAULT ON A POWER TRANSMISSION LINE

[75] Inventors: Kent Wikström, Västerås; Lennart Ängquist, Enköping, both of Sweden

[73] Assignee: Asea Brown Boveri AB, Vasteras, Sweden

[21] Appl. No.: 327,246

[22] Filed: Mar. 22, 1989

[30] Foreign Application Priority Data

Mar. 25, 1988 [SE] Sweden .................... 8801122

[51] Int. Cl.⁴ ............................................ G01R 31/08
[52] U.S. Cl. ..................................... 324/522; 324/521
[58] Field of Search ............... 324/522, 521, 509, 539; 361/79

[56] References Cited

U.S. PATENT DOCUMENTS

| | | | |
|---|---|---|---|
| 3,758,763 | 9/1973 | Nohara et al. | 324/76 R |
| 4,107,778 | 8/1978 | Nii et al. | 324/522 |
| 4,215,412 | 7/1980 | Bernier et al. | 364/551 |
| 4,314,199 | 2/1982 | Yamaura et al. | 324/522 |
| 4,377,833 | 3/1983 | Udren | 361/79 |
| 4,525,665 | 6/1985 | Smalley | 324/522 |
| 4,559,491 | 12/1985 | Saha | 324/522 |
| 4,560,922 | 12/1985 | Heller | 324/522 |
| 4,811,154 | 3/1989 | Trenkler | 361/79 |

FOREIGN PATENT DOCUMENTS

| | | | |
|---|---|---|---|
| 3235239 | 3/1984 | Fed. Rep. of Germany | 324/522 |
| 174863 | 10/1983 | Japan | 324/522 |
| 50373 | 3/1984 | Japan | 324/522 |

OTHER PUBLICATIONS

Ljung-Soderstrom; "Theory and Practice of Recursive Identification"; 1983; pp. 323≅327.

Swedish patent application No. 8702683-7, "Frequency Relay", corresponding to U.S. patent application Ser. No. 212,225, filed 6/27/88; p. 512.

"A Prototype of Multiprocessor Based Distance Relay"; IEEE Transaction on Power Apparatus and Systems: vol. PAS-101, No. 2; Feb. 1982; pp. 491-497.

N. Ashton; "Power System Protection"; Part 1; pp. 279-283; published by P. Peregrinus Ltd., Stevenage UK; Hertz 1981, New York.

*Primary Examiner*—Reinhard J. Eisenzopf
*Assistant Examiner*—Maura K. Regan
*Attorney, Agent, or Firm*—Watson, Cole, Grindle & Watson

[57] ABSTRACT

A device for determining the location of a fault at a fault position (F) on a power transmission line between two stations (P, Q), and in which the power transmission line has an unknown conduction impedance ($Z_{PQ}$), wherein, at one of the stations (P), capacitive voltage measuring transformers measure the phase voltage ($U_{PM}$) and the phase currents ($I_P$) or changes in the phase currents ($\Delta I_P$) are measured on the occurrence of a fault. The phase voltage, phase currents or changes in the phase currents are low pass filtered; and the filtered phase voltage, phase currents or the change in the phase currents are converted from an analog to instantaneous digitized phase voltage, phase currents or changes in phase current values, respectively.

The fault distance $\alpha$ and a value of an apparent fault resistance $R_F$ at the fault location are calculated, using linear regression, on the basis of the relationship:

$$U_{PM} = \alpha Z_{PQ} I_P + R_F I_P + \Delta U_{CVT},$$

where $\alpha$ represents a measure of the fault position, $U_F$ represents a voltage across the fault position and $\Delta U_{CVT}$ represents a fault voltage introduced by said capacitive voltage measuring means.

The fault distance is compared with an upper ($\alpha_{max}$) and a lower ($\alpha_{min}$) limit value and the apparent fault resistance is compared with an upper ($R_{Fmax}$) and a lower ($R_{Fmin}$) limit value. A tripping signal is generated when the fault position and the apparent fault resistance, respectively, are within the aforesaid limit values.

6 Claims, 1 Drawing Sheet

METHOD AND A DEVICE FOR FAULT LOCATION IN THE EVENT OF A FAULT ON A POWER TRANSMISSION LINE

TECHNICAL FIELD

For protection of cables and overhead power transmission lines so-called distance protection devices are used. These may be based on different technical principles, often based on a certain region of operation in an impedance plane or in the form of a wave detector based design. In this connection it is normally desirable to find out the distance from a measuring station to a possible fault and also to be able to determine the magnitude of the fault resistance. The distance protection devices therefore often comprise so-called fault locators. The present invention comprises a method and a device for achieving better performance when determining the distance to a fault from a measuring station as well as the magnitude of the fault resistance.

BRIEF DESCRIPTION OF THE DRAWING

The prior art and the invention will now be described on the basis of and with reference to the following figures.

BACKGROUND ART, THE PROBLEM

The principles of fault location and determination of the fault resistance when a fault has occurred on a protected line distance are well known. The basis normally consists of measured values obtained with the aid of measuring transformers in a measuring station located adjacent to the protected line. Present-day technique comprises analog-to-digital (A/D) conversion and filtering of the measured values which then, via different distance protection equations, determine the fault distance and the magnitude of the fault resistance. To be able to describe the invention in the best way, a brief summary will first be given of distance protection equations which are often used and of how these are solved according to the prior art. Finally, the problems which arise in connection with the determination of fault distance and fault resistance, depending on the measuring principles used, will also be described.

Figure 1:
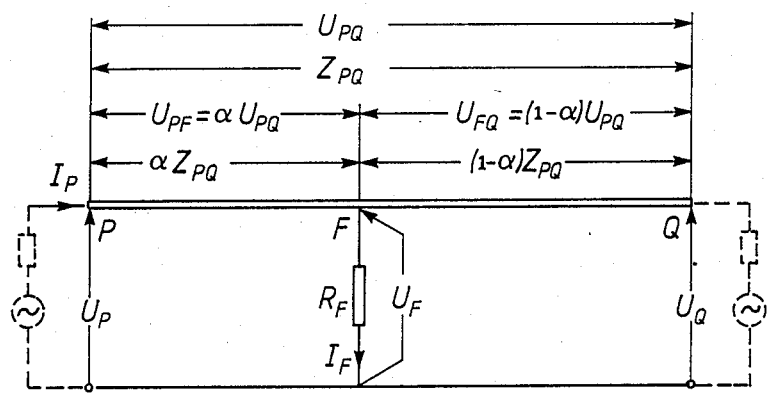
FIG. 1 shows an imaginary line between stations P and Q on which a fault to ground has arisen at F. Otherwise, the figure comprises the voltages, currents, impedances, and so on, included in the description.

As indicated above, there are several alternative distance protection equations. Two of the most ordinary ones will be briefly described with reference to FIG. 1. Both of these presuppose knowledge of the faultless line impedance $Z_{PQ}$ on the protected line distance between two measuring stations P and Q. After the determination of a fault, the voltages $U_P$ and $U_Q$ and the currents $I_P$ and $I_Q$ can be measured in the respective stations. In order to eliminate the need for communication between the stations, however, the values at one of the stations are normally the starting-point. If the assumption is made that a current $I_F$ flows through a fault resistance $R_F$, whereby a voltage $U_F$ lies across the fault resistance, the following relationship can be set:

$$U_P = U_{PF} + U_F = \alpha U_{PQ} + U_F = \alpha Z_{PQ} I_P + R_F I_F \quad (1)$$

Here, $\alpha (=0-1)$ is, for the time being, an assumed measure of the fault position and $U_{PQ}$ is a voltage drop across the whole line reconstructed with the aid of $I_P$.

Equation (1) is, of course, not directly solvable because of too many unknown parameters and therefore a certain amount of assumptions must be made to be able to solve it. In a conventional distance protection device, it is common to assume that the fault current $I_F$ is proportional to the current measured in station P, i.e.

$$I_F = k_1 I_P \quad (2)$$

This assumption is fulfilled if the e.m.f.'s $E_P$ and $E_Q$ at P and Q have equal phases and if the phase angles for the impedances counting from the fault location F to the respective e.m.f. are equal. Equation (1) can then be written as follows $$U_P = \alpha Z_{PQ} I_P + R_F k_1 I_P = \alpha Z_{PQ} I_P + R_{F1} I_P \quad (3)$$

where $R_{F1}$ is an apparent fault resistance during the calculation.

Another variant of the necessary assumption is to assume that the fault current is proportional to the current change at P when a fault has occurred, i.e.

$$I_F = k_2 \Delta I_P \quad (4)$$

whereby equation (1) can be expressed as $$U_P = \alpha Z_{PQ} I_P + R_F k_2 \Delta I_P = \alpha Z_{PQ} I_P + R_{F2} \Delta I_P \quad (5)$$

Both equations (3) and (5) comprise two unknown parameters, $\alpha$ and $R_{F1}$ or $R_{F2}$, respectively. This means that a special method of solution is needed to be able to solve these unknown parameters. Such a method may be a linear regression, a technique which has been described in detail in, for example, Ljung-Söderströ's "Theory and Practice of Recursive Identification", 1983, especially pages 323–327. Suitably, a form of linear regression is also used, which comprises a forgetting factor in order to adapt equations (3) and (5) to the existing measuring conditions.

A summary of the used technique is given in, inter alia, Swedish patent application 8702683-7, "Frequency relay", pages 5–10.

The method using linear regression and the least square method to solve distance equations of the same types as (3) and (5) is also described in an article entitled "A Prototype of Multiprocessor Based Distance Relay", published in IEEE Transaction on Power Apparatus and Systems, Vol. PAS-101, No. 2, Feb. 1982, pages 491–497.

When distance protection devices with fault location and determination of the fault resistance are used for high voltage transmission, capacitive voltage transformers, CVT, are usually used for the voltage measurement. It is well known that such voltage measurement, especially in the case of a large amplitude reduction in connection with the occurrence of the fault and especially if the fault occurs at the zero passage of the voltage, causes a measurement error voltage, generally called CVT transients. This is described, among other things, in an article by N. Ashton in Power System Protection, part 1, pages 279–283, published by P. Peregrinus Ltd., Stevenage UK, Hertz 1981, New York.

Figure 2:
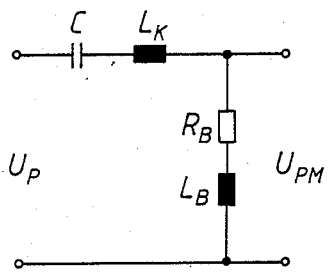
FIG. 2 shows an equivalent diagram for a capacitive voltage measuring device, a so-called CVT transformer.

There is a relatively simple physical explanation of this. The equivalent diagram for such a voltage measurement will be clear from FIG. 2. Here, $U_P$ is the high voltage to be measured and $U_{PM}$ is the measured voltage delivered by the capacitive voltage transformer.

A CVT measurement comprises, in addition to a capacitive voltage divider C, a compensating inductor $L_K$ and an ordinary magnetic transformer whose burden is symbolized by the inductance $L_B$ and the resistance $R_B$.

The transmission function $U_{PM}/U_P$ will consequently be $$G_{CVT} = \frac{U_{PM}}{U_P} = \frac{R_B + sL_B}{R_B + sL_B + sL_K + 1/sC} \quad (6)$$

By choosing $L_K$ and C so that $$j\omega_0 L_k + \frac{1}{j\omega_0 C} = 0 \quad (7)$$

where $\omega_0$ corresponds to the mains frequency $f_0$, the transmission function at mains frequency will always be $$G_{CVT}(j\omega_0) = 1 \quad (8)$$

independently of the load and the power.

However, at low frequencies the transmission function will be $$G_{CVT}(j\omega) = \frac{sR_B C}{1 + sR_B C} \quad (9)$$

which leads to an aperiodic transient with a time constant $T = R_B C$ after a voltage change. For a typical load of 150 VA, T will normally vary between 50 and 150 ms.

When fault situations arise, decisions on what actions to take to prevent harmful influence are usually very urgently required. For the very rapid evaluation methods that are nowadays available to determine the unknown parameters in equations (3) and (5), the incorrect measurement error voltage, introduced by the CVT transformer, involves extensive, incorrect evaluations and conclusions. Since the CVT transients have been known for a long time, different methods have also been used to reduce the effect of these. The most frequently used means have been to filter out the CVT transients in various ways. The disadvantage of such a method is then also a delay of a true evaluation.

DISCLOSURE OF THE INVENTION

Because of the introduced DCT measurement error voltage, the above-mentioned assumptions as regards the distance protection equations will entail considerable errors in the determination of fault position and fault resistance. It has also been found that the measurement error voltage mainly has a low frequency spectrum. According to the invention, the distance protection equations described above will therefore be supplemented by a voltage $\Delta U_{CVT}$ *which is intended to represent the low frequency measurement error voltage. This means that the distance protection equations can be generally described as*

$$U_{PM} = U_{PM}(\text{true}) + \Delta U_{CVT}(\text{low frequency}) = \alpha U_{PQ} + U_F + + \Delta U_{CVT} \quad (10)$$

which equation gives rise to the increased instantaneous value models $$U_{PM1} = \alpha Z_{PQ} I_P + R_{F1} I_P + \Delta U_{CVT} \quad (11)$$

and $$U_{PM2} = \alpha Z_{PQ} I_P + R_{F2} \Delta I_P + \Delta U_{CVT} \quad (12)$$

Thus, the invention comprises starting from any of these assumptions and trying to find the parameters $\alpha$, $R_{F1}$ or $R_{F2}$ and $\Delta U_{CVT}$ by linear regression. Simulations have shown that with this assumption a considerable improvement of the determination of fault positions and apparent fault resistance has been obtained. The most important information received is, of course, the value of $\alpha$. Since normally measurement is performed in only one station, no direct measure of the previously described constants of proportionality $k_1$ and $k_2$ can be obtained. This means that the real fault resistance $R_F$ cannot be stated. Since the distance relays normally work in the 1st quadrant of the impedance plane, the relay must not, of course, trip for a load resistance which lies within the transmission capacity of the line. The limit values for the resistance which are to result in tripping (see further under DESCRIPTION OF THE PREFERRED EMBODIMENTS), must therefore be indicated on the basis of normal load and an assumed value of $k_1$ or $k_2$ and of the apparent resistance $R_{F1}$ or $R_{F2}$, respectively.

Normally, up to 80–90% of the line distance is covered by the fault location.

DESCRIPTION OF THE PREFERRED EMBODIMENTS

Figure 3:
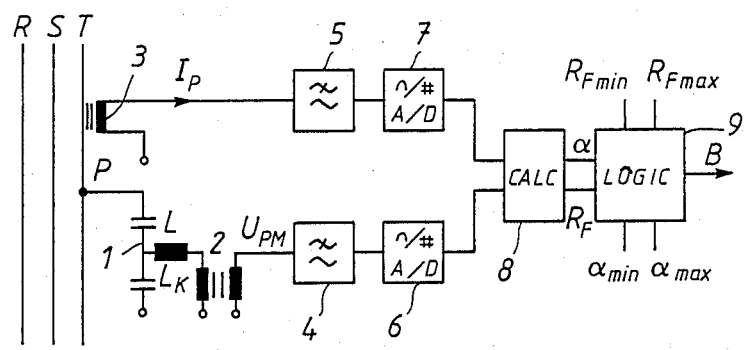
FIG. 3 shows a device according to the invention for determining the fault position and the fault resistance.

A preferred embodiment of a device for fault location according to the invention will be clear from FIG. 3. On a high voltage network RST and at a measuring station P, phase votages $U_P$ and phase currents $I_P$ are measured. As will have been clear from the foregoing description, at least two different distance protection equations (11) and (12) can be made the starting-point. If equation (11) is made the starting-point, the device for fault location is continuously switched in and controls the state of the line. If equation (12) is made the starting-point, a least prescribed change of $I_P$ must be assumed to initiate the control of the state of the line. These are obvious conditions for a distance relay and will not, therefore, be further described.

As described above, the measuring voltage $U_{PM}$ is obtained via a capacitive voltage divider 1 and a conventional transformer 2. The current $I_P$ is measured in conventional manner with a current transformer 3.

The measured values are low-pass filtered in filters 4 and 5, frequencies in excess of 500 Hz normally being filtered out and converted to digital representation in devices 6 and 7. The instantaneous digitized current and voltage values are supplied to a calculator (CALC) 8, which processes any of the described models according to (11) and (12) by means of linear regression technique. This results in estimated values of the parameters of the equations, that is, $\alpha$ which represents the fault position, $R_{F1}$ and $R_{F2}$, respectively, which represent the apparent fault resistance, and $\Delta U_{CVT}$ which represents the fault voltage.

The voltage $\Delta U_{CVT}$ is, strictly speaking, of no further interest.

The values of α, $R_{F1}$ and $R_{F2}$, produced by the calculator, are supplied to a logic unit (LOGIC) 9 for comparison with inputted upper and lower limit values $α_{min}$, $α_{max}$, $R_{Fmin}$ and $R_{Fmax}$, respectively. If the obtained α- and $R_F$-values lie within the stated limits, a decision B to trip is given.

The alternative embodiments which are available entail more or less integrated combinations of the devices for filtering, for conversion to digital representation, for the linear regression and for the necessary logic decisions.

We claim:

1. A device for determining the location of a fault at a fault position (F) on a power transmission line between two stations (P, Q) and in which the power transmission line has an unknown conduction impedance ($Z_{PQ}$), comprising at one of said stations (P):

capacitive voltage measuring transformers means for measuring the phase voltage ($U_{PM}$);

means for measuring the phase currents ($I_p$) or changes in the phase currents ($ΔI_p$) on the occurrence of a fault;

means for low pass filtering said phase voltage and said phase currents or changes in the phase currents; and means for converting the filtered phase voltage, phase currents or the change in the phase currents from an analog to instantaneous digitized phase voltage, phase currents or changes in phase current values, respectively;

said device further comprising:

means for calculating a value of the fault distance α and a value of an apparent fault resistance $R_F$ at the fault location, using linear regression, on the basis of the relationship:

$$U_{PM} = αZ_{PQ}I_P + R_F I_P + ΔU_{CVT},$$

where α represents a measure of the fault position, $R_F I_P$ represents a voltage across the fault position and $ΔU_{CVT}$ represents a fault voltage introduced by said capacitive voltage measuring means; and means for comparing said fault distance α with an upper ($α_{max}$) and a lower ($α_{min}$) limit value and for comparing said apparent fault resistance with an upper ($R_{Fmax}$) and a lower ($R_{Fmin}$) limit value and generating a tripping signal when the fault position and the apparent fault resistance, respectively, are within the aforesaid limit values.

2. A device according to claim 1, wherein said means for calculating uses the relationship:

$$U_{PM1} = αZ_{PQ}I_P + R_{F1}I_P + ΔU_{CVT}$$

and determines the first apparent fault resistance $R_{F1}$ value using the assumption that the fault current is substantially equal to the measured current at said one station (P).

3. A device according to claim 1, wherein said means for calculating uses the relationship:

$$U_{PM2} = αZ_{PQ}I_P + R_{F2}I_P + ΔU_{CVT}$$

and determines a second apparent fault resistance value $R_{F2}$ using the assumption that the fault current is equal to the measured change in the current on the occurrence of the fault.

4. A method for determining the location of a fault at a fault position (F) on a power transmission line between two stations (P, Q) and in which the power transmission line has an unknown conduction impedance ($Z_{PQ}$), comprising, at one of said stations (P), the steps of:

measuring the phase voltage ($U_{PM}$) with capacitive voltage measuring transformers;

measuring the phase currents ($I_P$) or changes in the phase currents ($ΔI_P$) on the occurrence of a fault;

low pass filtering said phase voltage and said phase currents or changes in the phase currents; and converting the filtered phase voltage, phase currents or the change in the phase currents from an analog to instantaneous digitized phase voltage, phase currents or changes in phase current values, respectively;

said method further comprising the steps of:

calculating a value of the fault distance α and a value of an apparent fault resistance $R_F$ at the fault location, using linear regression, on the basis of the relationship:

$$U_{PM} = αZ_{PQ}I_P + R_F I_P + ΔU_{CVT},$$

where α represents a measure of the fault position, $R_F I_P$ represents a voltage across the fault position and $ΔU_{CVT}$ represents a fault voltage introduced by said capacitive voltage measuring means;

comparing said fault distance α with an upper ($α_{max}$) and a lower ($α_{min}$) limit value and for comparing said apparent fault resistance $R_F$ with an upper ($R_{Fmax}$) and a lower ($R_{Fmin}$) limit value and generating a tripping signal when the fault position α and the apparent fault resistance $R_F$ are within predetermined limits.

5. A method according to claim 4, wherein said step of calculating uses the relationship:

$$U_{PM1} = αZ_{PQ}I_P + R_{F1}I_P + ΔU_{CVT}$$

and determines a first apparent fault resistance value $R_{F1}$ using the assumption that the fault current is substantially equal to the measured current at said one station (P).

6. A method according to claim 4, wherein said step of calculating uses the relationship:

$$U_{PM2} = αZ_{PQ}I_P + R_{F2}I_P + ΔU_{CVT}$$

and determines a second apparent fault resistance value $R_{F2}$ using the assumption that the fault current is equal to the measured change in the current on the occurrence of the fault.

* * * * *